United States Patent [19]

Wolter

[11] Patent Number: 4,677,457
[45] Date of Patent: Jun. 30, 1987

[54] SEMICONDUCTOR DEVICE WITH BIDIMENSIONAL CHARGE CARRIER GAS

[75] Inventor: Joachim H. Wolter, Waalre, Netherlands

[73] Assignee: U.S. Philips Corporation, New York, N.Y.

[21] Appl. No.: 819,650

[22] Filed: Jan. 17, 1986

[30] Foreign Application Priority Data

Jan. 28, 1985 [NL] Netherlands ............... 8500218

[51] Int. Cl.$^4$ .................................. H01L 29/06
[52] U.S. Cl. ..................................... 357/56; 357/15; 357/16; 357/22
[58] Field of Search ................... 357/16, 22, 15, 56

[56] References Cited

U.S. PATENT DOCUMENTS 4,538,165  8/1985  Chang et al. ................... 357/16
4,550,331 10/1985  Milano ........................... 357/22 A
4,559,547 12/1985  Shiraki et al. .................. 357/22 A Primary Examiner—Edward J. Wojciechowicz
Attorney, Agent, or Firm—Paul R. Miller

[57] ABSTRACT

A semiconductor device having a hetero-junction (3) between a semiconductor layer (2A,B) having a larger band gap and a semiconductor layer (1) having a smaller band gap, in which a bidimensional charge carrier gas (4) is formed, which is limited to a mesa-shaped part (5) of the layer structure. According to the invention, the sidewall (6) of the mesa extends to within the semiconductor layer (2) having the larger band gap, but does not extend as far as the semiconductor layer (1) having the smaller band gap in order to avoid surface traps at the edge of the mesa. Application inter alia is in HEMT devices and ballistic transistors.

15 Claims, 8 Drawing Figures

SEMICONDUCTOR DEVICE WITH BIDIMENSIONAL CHARGE CARRIER GAS

The invention relates to a semiconductor device having a semiconductor body comprising a layer structure with at least one hetero-junction between a first semiconductor layer having a smaller band gap and a second semiconductor layer having a larger band gap, in which a substantially bi-dimensional charge carrier gas is formed in the first semiconductor layer near the hetero-junction by diffusion of charge carriers from the second semiconductor layer into the first semiconductor layer, which charge carrier gas is practically limited to a region located within a part of the layer structure projecting in the form of a mesa with this mesa-shaped part having a sidewall which is at least in part free from electrodes. Such a device is known from the book of Nishizawa "Semiconductor Technologies", Tokyo 1982, pages 258–271, more particularly FIG. 19.13. In this book, lateral HEMT (High Electron Mobility Transistor) devices are described, in which near a hetero-junction between a semiconductor layer having a smaller band gap and a semiconductor layer having a larger band gap a bidimensional electron gas is formed in the layer having the smaller band gap. This is due to the fact that under the influence of the band curvature near the hetero-junction, at a small distance from the hetero-junction, an electric potential maximum, i.e. for electrons an energy minimum, occurs in the semiconductor material having the smaller band gap. By diffusion of electrons from the material having the larger band gap to the material having the smaller band gap, an electron cloud which has a very small thickness and is consequently practically bidimensional is formed in situ. The electrons present therein have a considerably increased mobility. This is due to the fact that these electrons are spatially separated from the donor ions from which they originate. In the HEMT structures described here, the bidimensional electron gas forms the current channel from the source zone to the drain zone; and the electron concentration thereof can be controlled by means of a gate electrode provided between the source and drain electrodes on the channel region.

Apart from the manufacture of lateral transistors, in which the source and drain zones are located beside each other on the semiconductor wafer, such a layer structure may also be used in the form of a so-called ballistic transistor. A vertical ballistic hetero-junction transistor is described, for example, in the published European Patent Application No. 0084393 A2. In this case, a very thin first semiconductor layer having a smaller band gap is located between a second semiconductor layer having a larger band gap and serving as a drain electrode and a third semiconductor layer serving as a source electrode. In the thin first semiconductor layer there is formed the bidimensional electron gas, which acts as a gate electrode and whose potential is determined by a connection contact provided on the first semiconductor layer. The charge carriers which move from the source electrode to the drain electrode cross the first layer practically without interaction with the bidimensional electron gas. The current from the source electrode to the drain electrode is in this case consequently practically perpendicular to the bidimensional electron gas and is controlled by varying the potential of the electron gas via the connection contact.

It is generally desirable to limit the active part of the semiconductor device, within which the bidimensional charge carrier gas is situated, to a given region, for example to the channel region of a HEMT device. For this purpose, in known devices, this region is mostly limited to a mesa-shaped part of the layer structure. In known devices, this mesa is etched entirely through the first semiconductor layer having the smaller band gap. Although the bidimensional charge carrier gas is thus effectively limited to the region of the mesa, such a structure has important disadvantages. In fact the first semiconductor layer then terminates at the sidewall of the mesa. Thus, this first semiconductor layer is given a new (edge) surface with associated band curvature. Due to the "traps" always present at or near such a surface, charge carriers will disappear from the bidimensional charge carrier gas near the edge of the mesa, and the first semiconductor layer having the smaller band gap will lose the major part of its in situ conductivity. It is clear that this is disadvantageous especially in those cases in which the dimensional charge carrier gas has to convey the main current of the device. When the dimensions of the part of the layer structure projecting in the form of a mesa are very small, the conductivity of the first semiconductor layer having the smaller band gap may even be reduced substantially to zero in that substantially all the charge carriers have disappeared in the (edge) surface layer.

The invention has inter alia for its object to provide a semiconductor device of the kind described having a novel structure, in which on the one hand the bidimensional charge carrier gas is indeed practically limited to the part of the layer structure projecting in the form of a mesa, but in which on the other hand it is avoided that charge carriers disappear or are trapped near the edge of the mesa.

According to the invention, a semiconductor device of the kind described in the opening paragraph is characterized in that, at least at the area of the exposed part, the sidewall of the mesa-shaped part extends to within the second semiconductor layer having the larger band gap, but does not extend to the first semiconductor layer having the smaller band gap.

The invention is based inter alia on the recognition of the fact that an effective limitation of the bidimensional charge carrier gas to the mesa can be obtained when the mesa is limited to the second semiconductor layer and so is not etched into or through the first semiconductor layer. In this way it is avoided that a new edge surface of the first semiconductor layer with associated traps is formed, which would have the disadvantages described above, while the device can otherwise be operated in a usual manner and also retains all the further advantages of known devices of this kind.

It should be noted that in this Application the sidewall of the mesa is to be understood to mean the edge surface of the mesa, not extending parallel to the hetero-junction and to the surface.

The bidimensional charge carrier gas may consist of electrons or of holes, depending upon the materials and conductivity types of the semiconductor layers. Since in general the mobility of electrons is higher than that of holes, especially for applications in which the current conduction takes place by means of the bidimensional charge carrier gas, the semiconductor layer having the larger band gap, which has to supply the charge carriers, will be at least in part n-type conducting. At the area of the hetero-junction, in the first semiconductor layer the lower edge of the conduction band should be lower than in the second semiconductor layer and lower than the Fermi level, so that an energy minimum for electrons occurs in the first semiconductor layer and a bidimensional electron gas is formed. In practice, preferably the material used for the n-type conducting second semiconductor layer having the larger band gap is gallium aluminium arsenide and the material used for the first semiconductor layer having the smaller band gap is gallium arsenide. Of these materials, the technological and electrical properties are favourable and well known. However, other semiconductor materials, either other III–V or II–VI compounds or mixed crystals thereof, or elementary semiconductors, such as, for example, germanium or silicon, may also be used for one or for both of the first and second semiconductor layers.

When this is preferred from a technological point of view (for example when using semiconductor materials that can be more readily p-doped than n-doped) or for other reasons, a device with a bidimensional hole gas can be used. The part of the second semiconductor layer having the larger band gap which supplies the holes is then p-type conducting, while at the area of the hetero-junction the upper edge of the valency band has to lie in the first semiconductor layer higher than in the second semiconductor layer and higher than the Fermi level so that a "hole gas" can be formed in the first semiconductor layer.

When the semiconductor device according to the invention is a transistor in which the bidimensional charge carrier gas forms the current channel, the second semiconductor layer having the larger band gap advantageously has such a doping and thickness that in the operating condition it is practically entirely depleted. As a result, the current from the source electrode to the drain electrode flows entirely via the charge carrier gas, which generally consists of charge carriers having a high mobility.

A further important preferred embodiment is characterized in that the second semiconductor layer is a composite layer having at least one first sublayer, which adjoins the hetero-junction and is undoped, and a doped second sublayer which adjoins the first sublayer and supplies the charge carriers for the bidimensional charge carrier gas with the sidewall of the mesa extending at most as far as the first sublayer. This first sublayer serves to remove the activator ions (donor or acceptor ions) of the second sublayer farther from the bidimensional charge carrier gas, and thus to increase the mobility of the charge carriers present therein.

The term "undoped" is to be understood herein to mean: not intentionally doped. This consequently does not mean that an undoped layer does not comprise any donors or acceptors at all.

The first semiconductor layer having the smaller band gap will generally be provided on a substrate. Preferably, a practically insulating substrate of, for example, semi-insulating gallium arsenide will be chosen for this purpose, which substrate may be provided with a buffer layer in order to ensure that the epitaxial growth of the layer structure will take place as free from dislocations as possible.

When the second semiconductor layer having the larger band gap consists of a material which can be contacted only with difficulty, such as, for example, gallium aluminium arsenide, it may be advantageous to provide the second semiconductor layer at least at the area of a contact to be formed with a highly doped contact layer of another semiconductor material, for example gallium arsenide.

The invention is of particular importance in semiconductor devices in which, viewed in a direction parallel to the hetero-junction, the smallest dimension of the mesa-shaped part of the layer structure is smaller than 2 $\mu$m. With such small dimensions, the risk of elimination of the whole bidimensional charge carrier gas by trapping of charge carriers at the edge of the mesa is most serious, as set out above, because then each point of the mesa is located closely near the edge. This applies particularly to mesas having dimensions less than 0.5 $\mu$m, in which event the elimination in devices of the known structure will occur under virtually all circumstances.

The invention will now be described by way of example only with reference to a few embodiments and the drawings, in which:

FIG. 1 shows diagrammatically in plan view a semiconductor device according to the invention, FIGS. 2a and 2b show diagrammatically cross-sections taken on the lines II—II and of a semiconductor device having a known structure (FIG. 2a) and according to the invention (FIG. 2b) in a plan view as shown in FIG. 1, FIGS. 3a and 3b show diagrammatically cross-sections taken on the lines II—II and III—III of a semiconductor device having a known structure (FIG. 3a) and according to the invention (FIG. 3b) in a plan view as shown in FIG. 1.

Figure 1:
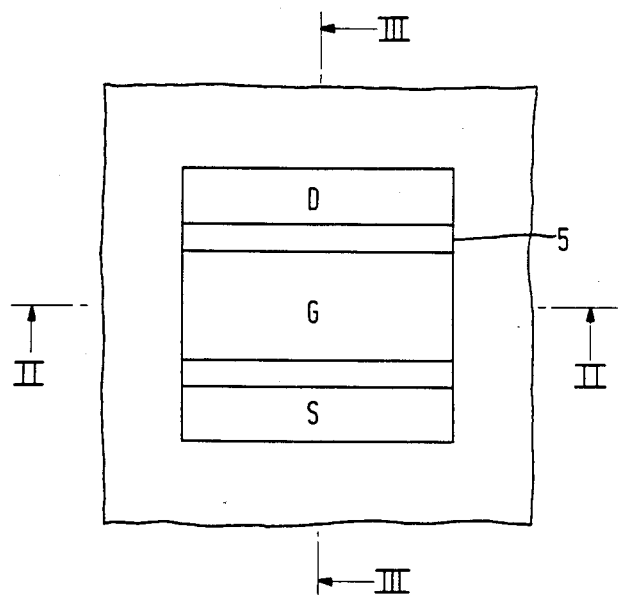

The Figures are purely schematic and not drawn to scale, while especially the dimensions in the direction of thickness are exaggerated. In the cross-sections, semiconductor regions of the same conductivity type are generally cross-hatched in the same direction. Corresponding parts are generally designated in the Figures by the same reference numerals.

Figure 2A:
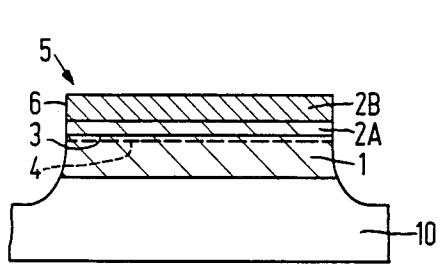
Figure 3A:
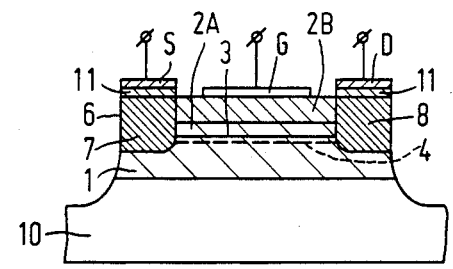

FIG. 1 shows diagrammatically a plan view of a semiconductor device with a bidimensional charge carrier gas, in the embodiment of the HEMT ("High Electron Mobility Transistor") type. FIGS. 2a and 3a show diagrammatically cross-sections taken on the lines II—II and III—III of FIG. 1, as they occur in a HEMT device of the known type.

The device has a semiconductor body comprising a layer structure having a first semiconductor layer 1 having a smaller band gap located in this embodiment on a substrate 10, and a second semiconductor layer 2 (A, B) having a larger band gap. The first and second semiconductor layers form a hetero-junction 3 where they adjoin each other. The diffusion of charge carriers from the second semiconductor layer 2 into the first semiconductor layer 1 forms a cloud 4 of charge carriers in the first semiconductor layer 1 near the hetero-junction 3, as will be explained more fully hereinafter with reference to FIG. 4. The thickness of the cloud 4 is very small with respect to its surface area so that this cloud can be considered as a substantially bidimensional charge carrier gas. This bidimensional charge carrier gas 4 is indicated by dotted lines in the cross-sections shown and is practically limited to a region located within a part 5 of the layer structure projecting in the form of a mesa. The circumference of the upper surface of this mesa-shaped part 5 is indicated in FIG. 1 by a full line.

There are arranged on the mesa 5 ohmic source and drain electrodes S and D, respectively, which are alloyed and are in contact via the alloy regions 7 and 8 with the second bidimensional charge carrier gas 4. There is disposed between the source and drain electrodes a gate electrode G, which is connected via a barrier layer (Schottky junction, pn junction or insulating layer) to the second semiconductor layer 2A, B. The mesa 5 has a sidewall 6, which is at least in part free from electrodes.

Figure 4:
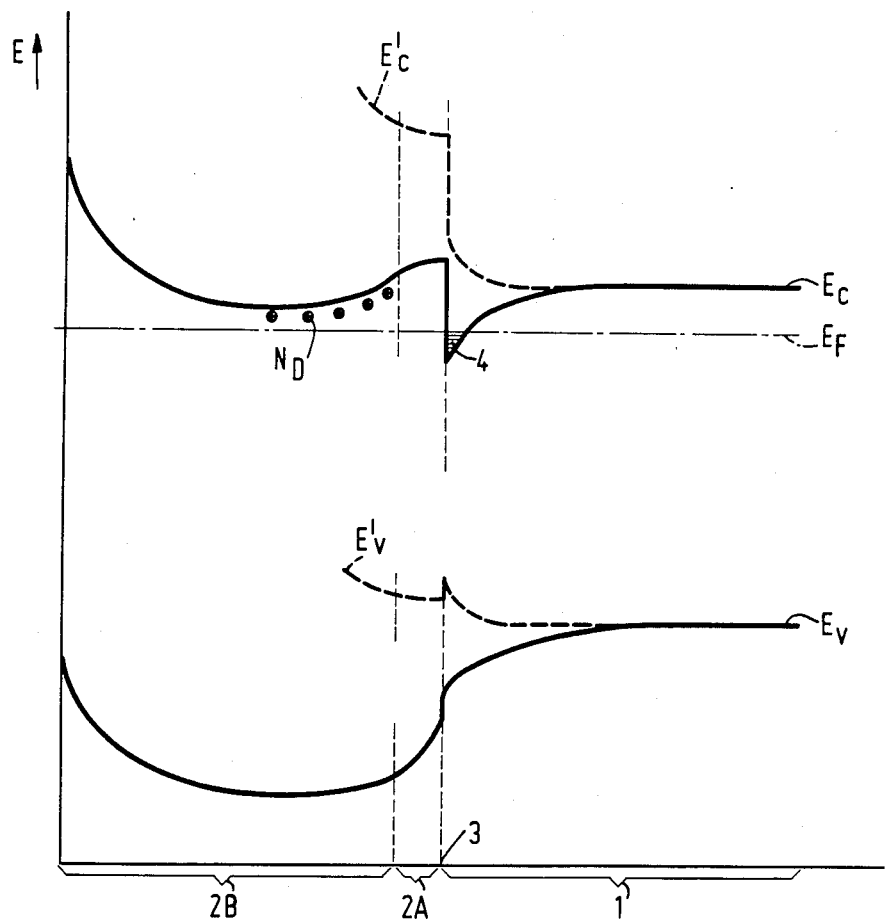
FIG. 4 shows the variation of the energy band structure in a semiconductor device according to the invention.

FIG. 4 shows diagrammatically the variation of the conduction and valency band in the layers 1, 2A and 2B of the layer structure described. By way of example, it is assumed here that the layer 1 consists of undoped, that is to say not intentionally doped, gallium arsenide and that the layers 2A and 2B both consist of gallium aluminium arsenide of the composition $Al_{0.3}Ga_{0.7}As$. The layer 2A is undoped; the layer 2B is n-type doped with a silicon doping of, for example, $10^{18}$ atoms/cm$^3$. The thicknesses of the layers 1, 2A and 2B are 2 μm, 20 nm, and 40 nm, respectively.

As can be seen in FIG. 4 (full lines), at the area of the hetero-junction 3 between the layers 1 and 2A the lower edge ($E_c$) of the conduction band in the layer 1 lies below the lower edge of the conduction band in the layer 2 and below the Fermi level $E_F$. As a result, electrons can diffuse from the layer 2A via the layer 2B into the layer 1 where they reach near the hetero-junction 3 energy states below $E_F$ (indicated by cross-hatched lines in FIG. 4) and form there the aforementioned bidimensional charge carrier gas, which is in this embodiment an electron gas (4).

The donor ions in the layer 2B, which have supplied the electrons for this electron gas, are indicated diagrammatically in FIG. 4, by "$N_D$". The undoped layer 2A serves to remove these ions still farther from the electron gas 4 and thus to increase the electron mobility therein. However, this layer 2A is not absolutely necessary.

In the known device, of which the cross-sections are shown in FIG. 2a and FIG. 3a, the side-wall 6 of the mesa-shaped part 5 extends through the second semiconductor layer 2(A, B) and through the first semiconductor layer 1 into the substrate 10. At the areas at which the source and drain electrodes (S, D, 7, 8) are not present (FIG. 2a), the charge carrier gas 4 extends as far as the sidewall 6. Due to crystal errors, adsorbed atoms etc. with associated traps, which are present near the surface 6, near this surface all or substantially all charge carriers of the charge carrier gas 4 can be trapped so that no charge carriers are available any longer for conduction. With a very small cross-section of the mesa 5, the bidimensional charge carrier gas 4 can thus even disappear completely.

Figure 2B:
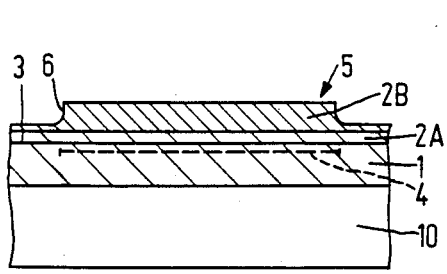
Figure 3B:
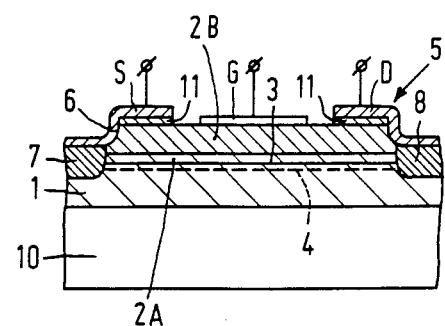

FIG. 2b and FIG. 3b show diagrammatically also cross-sections taken on the line II—II and III—III for a similar semiconductor device, of which the plan view is also shown in FIG. 1. However, in contrast with FIGS. 2a and 3a, FIGS. 2b and 3b show cross-sections of a device according to the invention.

According to the invention (cf. FIG. 2b), at least the part of the sidewall 6 of the mesa-shaped part 5 of the layer structure which is free from electrodes extends to within the semiconductor layer 2 having the larger band gap, but does not extend down to the first semiconductor layer 1 having the smaller band gap. Although in this case the bidimensional charge carrier gas 4 is not intersected by the sidewall 6 with the associated traps for electrons or holes, the charge carrier gas is nevertheless practically limited to the region of the mesa 5. In fact, outside the mesa the surface 6 approaches the hetero-junction 3 so closely that the donor ions in the second semiconductor layer 2A, B have disappeared for the major part and, due also to the occurring band curvature, no bidimensional electron gas is formed. See FIG. 4, in which the dotted lines $E'_c$ and $E'_v$ indicate the variation of the conduction and valency band edges for the case in which the thickness of the layer 2B outside the mesa 5 is zero or at least very small. No energy minimum for the charge carriers is then present in the first semiconductor layer 1 near the hetero-junction 3, and due to this fact formation of a bidimensional electron gas does not take place.

In the embodiment shown in FIGS. 2b and 3b, the substrate 10 may consist, for example, of semi-insulating gallium arsenide of very high resistivity, which may be provided with a grown buffer layer of gallium arsenide, in order to facilitate the epitaxial growth of the further layer structure. A layer 1 having a thickness of, for example, 2 μm of undoped gallium arsenide and subsequently a 20 nm thick undoped layer 2A of $Al_x Ga_{1-x}As$ with, for example, $x=0.3$, an n-type conducting layer 2B of the same semiconductor material, but having a doping of, for example, $10^{18}$ Si atoms/cm$^3$ and a thickness of, for example, 40 nm and then preferably a top layer 11 of highly doped gallium arsenide are grown thereon, on which latter layer the source and drain electrodes are provided because ohmic contacts cannot readily be formed on $Al_x Ga_{1-x}As$. Outside the source and drain electrodes, the layer 11 can be removed. A gate electrode G is further disposed between the source and drain electrodes (S, D, 7, 8) and forms with the layer 2B, for example, a rectifying Schottky contact, by which the conductivity of the bidimensional electron gas is controlled. A HEMT device thus constructed can be made suitable for operation both in the enhancement mode and in the depletion mode in the same manner as described for known devices in the aforementioned publication "Semiconductor Technologies" of Nishizawa in Section 19.3, p. 265–266. The material used for the source and drain electrodes may be, for example, Au-Ge/Au, while the material used for the gate electrode may be Ti/Pt/Au, but other metals or alloys may also be employed. The surface and the sidewall of the mesa may be provided, if desired, outside the electrodes with an insulating layer.

Suitable values for the thicknesses chosen are, for example, for layer 1:1.5–4.5 μm, for layer 2A: 5–40 nm (where $x=0.2-1$) and for layer 2B: a thickness of 30–60 nm, preferably so that the layer (2A, B) in operation is entirely depleted.

Figure 5:
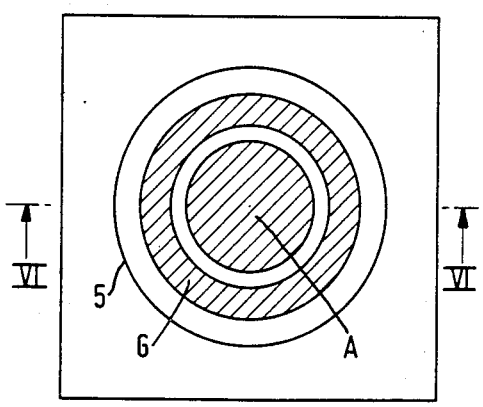
FIG. 5 shows diagrammatically a plan view of another semiconductor device according to the invention.
Figure 6:
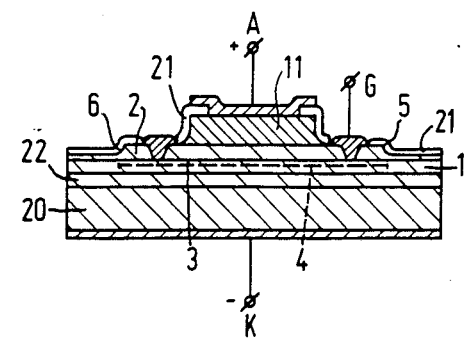
FIG. 6 shows diagrammatically a cross-section of the semiconductor device shown in FIG. 5 taken on the lines VI—VI.

FIGS. 5 and 6 show another embodiment of the semiconductor device according to the invention. FIG. 5 shows in plan view and FIG. 6 shows diagrammatically in cross-section taken on the line VI—VI a so-called ballistic transistor.

Like the semiconductor device described in the aforementioned embodiment, this semiconductor device comprises a first semiconductor layer 1 having a smaller band gap and a second semiconductor layer 2 forming with it a hetero-junction 3 and having a larger band gap. In this embodiment, the layer 1 is an undoped layer of gallium arsenide having a thickness of, for example, 50 nm. The layer 2 is an n-type layer of gallium aluminium arsenide having the composition $Al_{0.3}Ga_{0.7}As$, a doping of, for example, $10^{18}$ Si atoms/cm$^3$ and a thickness of 100 nm. The layer 11 is a highly n-doped contact layer of gallium arsenide. This contact layer 11 is provided with an anode contact A, while the layer 1 is provided with an annular gate contact G and the substrate is provided with a cathode contact K. In this embodiment, the substrate consists of a highly doped n-type conducting layer 20 of gallium arsenide on which is deposited an undoped layer 22 of gallium aluminium arsenide having a thickness of, for example, 25 nm. Outside the contacts, the semiconductor surface is coated with an insulating layer 21 of, for example, silicon oxide.

Also in this case, there is formed, as the case may be under the influence of the applied field between the anode and the cathode, in the layer 1 a bidimensional electron gas 4, whose potential can be varied by means of the gate contact G.

The layer 1 is sufficiently thin to allow electrons, which are injected under the influence of the field applied at right angles to the layer 1 between the anode and the cathode from the layer 20 via the layer 22 into the layer 1, to traverse this layer 1 practically without interaction with other particles or phonons, that is to say "ballistically". The layer 22 serves to supply these electrons with a sufficient amount of energy to traverse the layer 1 as "hot" electrons. The bidimensional electron gas 4 then serves as a gate electrode for controlling the electron current from the cathode to the anode, as described in the aforementioned European Patent Application EP No. 84393 of the Applicant.

The bidimensional electron gas 4 in this case is also limited to a region located within the mesa-shaped structure, whose edge is designated by reference numeral 5. Also in this case there is a risk of the electrons of the bidimensional electron gas 4 disappearing at least in part by surface effects if the sidewall 6 of the mesa extends through the first semiconductor layer 1 and thus forms an edge surface of this layer. According to the invention, however, the sidewall 6 (cf. FIG. 6) does not extend into the layer 1, and the lower side of the mesa 5 remains at a certain distance from the hetero-junction 3, as a result of which the problem is avoided.

The embodiment of a ballistic transistor shown here is the simplest form and serves only to illustrate the benefit of the invention also in this case. In practice, a larger number of layers will often be present in ballistic transistors, while the layer 2, like in the preceding embodiment, could consist of several layers, for instance in order to separate the electrons of the bidimensional electron gas more effectively from the donor ions in the layer 2.

It will be appreciated that the invention is not limited to the embodiments described, but that it can be used in all those cases in which the bidimensional charge carrier gas in contact with the edge surface of a mesa could be eliminated entirely or in part by trapping of the charge carriers near this surface. Furthermore, instead of the materials GaAs and $Al_xGa_{1-x}As$, which are used in the embodiments described, other semiconductor materials having different band gaps may be employed. Suitable materials are, for instance, other III-V components and mixed crystals thereof, for example InP, InAs, InSb, GaP, GaSb etc., II-VI compounds and mixed crystals thereof, for example CdSe, CdTe, CdS, ZnSe, ZnO etc., or elementary semiconductors, such as Ge and Si. Under certain circumstances, it may happen that instead of a bidimensional electron gas a bidimensional hole gas is used, in which event in the devices described, n-type conducting layers will be replaced by p-type conducting layers while the voltages applied are simultaneously reversed.

What is claimed is:

1. A semiconductor device of a semiconductor body comprising a layer structure including
   a first semiconductor layer having a first band gap,
   a second semiconductor layer having a second larger band gap,
   at least one hetero-junction between said first semiconductor layer and said second semiconductor layer, and
   a substantially bidimensional charge carrier gas in said first semiconductor layer near said hetero-junction, said bidimensional charge carrier gas being provided by diffusion of charge carriers from said second semiconductor layer into said first semiconductor layer,
   said layer structure further including a mesa-shaped part having a sidewall at least partially free from electrodes, said sidewall only extending to within said second semiconductor layer and not extending to said first semiconductor layer, said charge carrier gas being substantially limited to below said mesa-shaped part of said layer structure.

2. A semiconductor device according to claim 1, wherein said second semiconductor layer is at least in part n-type conducting, and wherein at said hetero-junction said first semiconductor layer has a conduction band with a lower edge being lower than the lower edge of the conduction band in said second semiconductor layer and being lower than the Fermi level such that said bidimensional charge carrier gas is formed in said first semiconductor layer.

3. A semiconductor device according to claim 2, wherein said second semiconductor layer is of n-type gallium aluminum arsenide, and said first semiconductor layer is gallium arsenide.

4. A semiconductor device according to claim 1, claim 2, or claim 3, wherein said second semiconductor layer is a composite layer including at least one undoped first sublayer adjoining said hetero-junction and a doped second sublayer adjoining said first sublayer, said doped second sublayer supplying charge carriers of said bidimensional charge carrier gas.

5. A semiconductor device according to claim 4, wherein said sidewall extends only to said undoped sublayer.

6. A semiconductor device according to claim 4, wherein said bidimensional charge carrier gas forms a current channel for a HEMT semiconductor, and wherein said second semiconductor has a doping concentration and thickness to be substantially entirely depleted in an operating state.

7. A semiconductor device according to claim 4, wherein said first semiconductor layer is provided on a substrate consisting at least in part of semi-insulating gallium arsenide.

8. A semiconductor device according to claim 4, wherein said second semiconductor layer is provided with a highly doped contact layer of another semiconductor material.

9. A semiconductor device according to claim 8, wherein said contact layer is gallium arsenide.

10. A semiconductor device according to claim 4, wherein said mesa-shaped part has a smallest dimension in a direction parallel to said hetero-junction of smaller than 2 μm.

11. A semiconductor device according to claim 1, claim 2 or claim 3, wherein said bidimensional charge carrier gas forms a current channel for a HEMT semiconductor, and wherein said second semiconductor has a doping concentration and thickness to be substantially entirely depleted in an operating state.

12. A semiconductor device according to claim 1, claim 2 or claim 3, wherein said first semiconductor layer is provided on a substrate consisting at least in part of semi-insulating gallium arsenide.

13. A semiconductor device according to claim 1, claim 2 or claim 3, wherein said second semiconductor layer is provided with a highly doped contact layer of another semiconductor material.

14. A semiconductor device according to claim 13, wherein said contact layer is gallium arsenide.

15. A semiconductor device according to claim 1, claim 2 or claim 3, wherein said mesa-shaped part has a smallest dimension in a direction parallel to said hetero-junction of smaller than 2 μm.

* * * * *